United States Patent
Yamashiroya

[11] Patent Number: 5,872,738
[45] Date of Patent: Feb. 16, 1999

[54] SEMICONDUCTOR INTEGRATED CIRCUIT DEVICE FOR ENABLING EASY CONFIRMATION OF DISCRETE INFORMATION

[75] Inventor: Atsushi Yamashiroya, Tokyo, Japan

[73] Assignee: NEC Corporation, Tokyo, Japan

[21] Appl. No.: 933,397

[22] Filed: Sep. 19, 1997

[30] Foreign Application Priority Data

Sep. 20, 1996 [JP] Japan .................................... 8-250114

[51] Int. Cl.$^6$ ....................................................... G11C 7/00
[52] U.S. Cl. ........................ 365/200; 365/185.33; 365/78
[58] Field of Search ........................ 395/800; 365/185.33, 365/78, 189.04, 189.12

[56] References Cited

U.S. PATENT DOCUMENTS

| 572,466 | 11/1896 | Sukegawa | 365/185.33 |
| 5,168,463 | 12/1992 | Ikeda et al. | 365/78 |
| 5,511,211 | 4/1996 | Akao et al. | 395/800 |

FOREIGN PATENT DOCUMENTS

| W/O9102258 | 2/1991 | WIPO . |
| W/O9509424 | 4/1995 | WIPO . |

OTHER PUBLICATIONS

IBM Technical Disclosure Bulletin, vol. 26, No. 8, Jan. 1984 "Module Documentation Chip" by W. Mayr et al.
Patent Abstracts of Japan, Publication No. 02245835, dated Oct. 1, 1990, Takeshi.

*Primary Examiner*—David Nelms
*Assistant Examiner*—Thong Le
*Attorney, Agent, or Firm*—Sughrue, Mion, Zinn, Macpeak & Seas, PLLC

[57] ABSTRACT

A semiconductor integrated circuit device including a logic area for executing logical operation and a history holding circuit for managing discrete information concerning respective device, the history holding circuit further comprising an EEPROM for holding discrete information, an input terminal for writing external information into the EEPROM and an output terminal for reading out information held in the EEPROM.

14 Claims, 3 Drawing Sheets

SEMICONDUCTOR INTEGRATED CIRCUIT DEVICE FOR ENABLING EASY CONFIRMATION OF DISCRETE INFORMATION

BACKGROUNDS OF THE INVENTION

1. Field of the Invention

The present invention relates to an LSI or other semiconductor integrated circuit device, and more particularly, to a semiconductor integrated circuit device for enabling easy confirmation of manufacture information, operational status, failure occurrence information and other discrete information.

2. Description of the Related Art

Maintenance work for a system incorporating LSIs or other semiconductor integrated circuit devices sometimes requires management of discrete information concerning the semiconductor integrated circuit devices incorporated. Discrete information herein includes the serial number, electric characteristics, delay characteristics, and in some cases current-carrying time and failure history of such semiconductor integrated circuit devices.

Generally, an LSI, a semiconductor integrated circuit device, has its serial number printed on its surface. As to detailed information that cannot be inscribed on the surface of the chip entirely, for example, the electric characteristics and delay characteristics of such LSI, it must be managed by creating a separate file containing these pieces of information.

After the LSI chip has actually been incorporated in a certain electronic device, however, the surface of such chip cannot be seen from outside the device, so the only way to manage discrete information concerning the LSI is using a file described above. Media that can be employed to create such a file include a magnetic disk and other digital storage medium, and paper. Whatever medium may be used, entering and editing data in the file must be done manually.

Also, if a failure should occur in the electronic device incorporating such LSIs, the system maintenance manager must identify the LSI in which the failure has occurred, and write the finding into the above-mentioned file as part of the failure history. This is done manually or by the maintenance function of the electronic device incorporating such LSIs.

Furthermore, if a failure occurs in a specific LSI frequently, it is necessary to take out such LSI, replace it with a good one, and analyze the LSI taken out to identify the content of the failure. In this case, the system maintenance manager must prepare a report stating the content of the failure and the current-carrying time for the LSI, and hand it to the analyzing personnel, together with the LSI.

As described above, the conventional method of managing discrete information concerning semiconductor integrated circuit devices incorporated in an electronic devices requires management via files created for individual semiconductor integrated circuit devices, consuming considerable labor and time.

Management via files is done manually, generating a fear of mistakes when inputting or editing data.

In order to see the information printed on the surface of a semiconductor integrated circuit device, considerable labor- and time-consuming work to disassemble the frame of the electronic device is necessary, which is fairly impractical.

Preparation of a failure history for a semiconductor integrated circuit device and a report stating the content of a failure in the semiconductor integrated circuit device is done manually, requiring considerable time and labor as well as generating a fear of mistakes occurring.

Furthermore, a semiconductor integrated circuit device or a card containing a semiconductor integrated circuit device is taken out for failure analysis and replaced later, leading to a drawback that information concerning current-carrying time which is required for failure analysis cannot be managed uniformly within an electronic device.

SUMMARY OF THE INVENTION

An object of the present invention is to provide a semiconductor integrated circuit device capable of reducing the time and labor required for managing and acquiring discrete information concerning the respective device, and preventing mistakes from occurring during the procedure for managing the discrete information, by incorporating a means of holding discrete information concerning the respective device.

Another object of the present invention is to provide a semiconductor integrated circuit device capable of reducing the time and labor required for preparing, managing and acquiring a failure history, and preventing mistakes from occurring during these procedures, by incorporating a means of automatically preparing and holding a failure history for the respective device.

According to one aspect of the invention, a semiconductor integrated circuit device, comprises logical operation means for executing logical operation, and history holding means for managing discrete information concerning the respective device, wherein the history holding means further comprises non-volatile storage means for holding the discrete information, input terminal for writing external information into the non-volatile storage means, and output terminal for reading out information held in the non-volatile storage means.

The non-volatile storage means of the history holding means may hold, as the discrete information, at least the serial number of respective device.

The non-volatile storage means of the history holding means may hold, as the discrete information, at least the serial number of respective device and the measurement results for various characteristics obtained by the logical operation means.

The non-volatile storage means of the history holding means may be an EEPROM.

In the preferred construction, the history holding means, when an error occurs in the logical operation means, inputs an error signal output from the logical operation means, and writes the value of the error signal into the non-volatile storage means.

In the preferred construction, the non-volatile storage means of the history holding means holds, as the discrete information, at least the serial number of respective device and the measurement results for various characteristics obtained by the logical operation means, and the history holding means, when an error occurs in the logical operation means, inputs an error signal output from the logical operation means, and writes the value of the error signal into the non-volatile storage means.

In the preferred construction, the history holding means further comprises power-on time counting means for counting the total current-carrying time by monitoring the ON/OFF status of the system power of the electronic device into which respective device is incorporated, writes the value counted by the power-on time counting means into the non-volatile storage means as necessary.

In another preferred construction, the non-volatile storage means of the history holding means holds, as the discrete information, at least the serial number of respective device and the measurement results for various characteristics obtained by the logical operation means, and the history holding means further comprises power-on time counting means for counting the total current-carrying time by monitoring the ON/OFF status of the system power of the electronic device into which respective device is incorporated, writes the value counted by the power-on time counting means into the non-volatile storage means as necessary.

In another preferred construction, the history holding means further comprises power-on time counting means for counting the total current-carrying time by monitoring the ON/OFF status of the system power of the electronic device into which respective device is incorporated, when an error occurs in the logical operation means, inputting an error signal output from the logical operation means and writes the value of the error signal into the non-volatile storage means, as well as writes the value counted by the power-on time counting means into the non-volatile storage means at that time.

In another preferred construction, the non-volatile storage means of the history holding means holds, as the discrete information, at least the serial number of respective device and the measurement results for various characteristics obtained by the logical operation means, the history holding means further comprises power-on time counting means for counting the total current-carrying time by monitoring the ON/OFF status of the system power of the electronic device into which own device is incorporated, when an error occurs in the logical operation means, inputting an error signal output from the logical operation means and writes the value of the error signal into the non-volatile storage means, as well as writes the value counted by the power-on time counting means into the non-volatile storage means.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to avoid obscuring the present invention.

Figure 1:
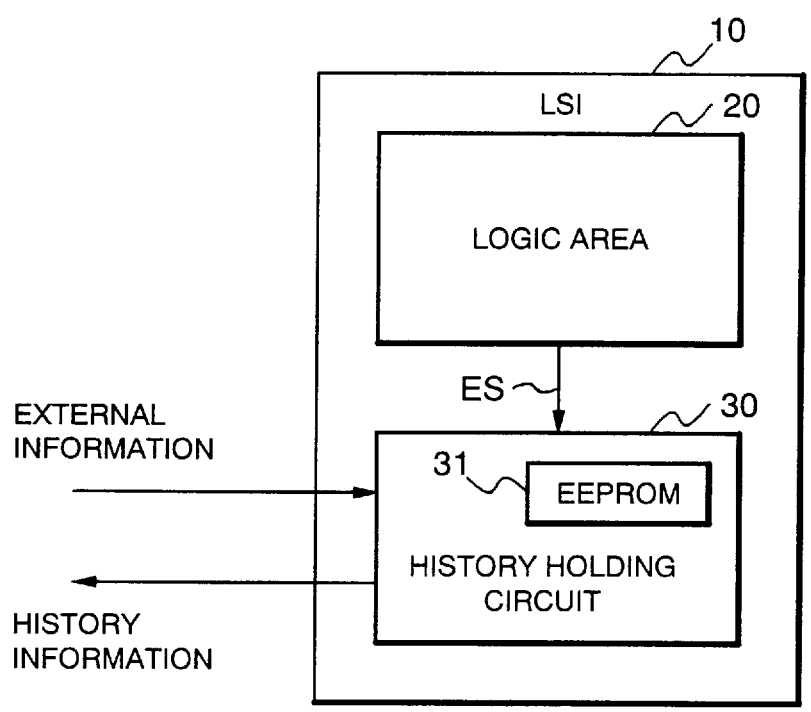
FIG. 1 is a block diagram showing the constitution of a semiconductor integrated circuit device according to one embodiment of the present invention.

FIG. 1 is a block diagram showing the constitution of a semiconductor integrated circuit device according to one embodiment of the present invention.

As shown in FIG. 1, a semiconductor integrated circuit device 10 according to the present embodiment (hereinafter abbreviated as an "LSI 10") includes a logic area 20 for executing ordinary logical processing and a history holding circuit 30 for managing discrete information concerning the device. The history holding circuit 30 includes a non-volatile memory area 31 and stores the discrete information on such LSI 10, including a failure history and current-carrying time. By storing discrete information in the non-volatile memory area 31, the data stored in the LSI 10 is maintained even after a power supply to the LSI 10 has been turned off. In the following explanation, a "non-volatile memory area 31" will be referred to as an "EEPROM 31" in light of the fact that the present embodiment uses an EEPROM as a non-volatile memory area. It should be noted, however, that non-volatile memory elements other than an EEPROM may be used in the present embodiment. For example, a flash RAM, may also be used as a non-volatile memory area.

Figure 2:
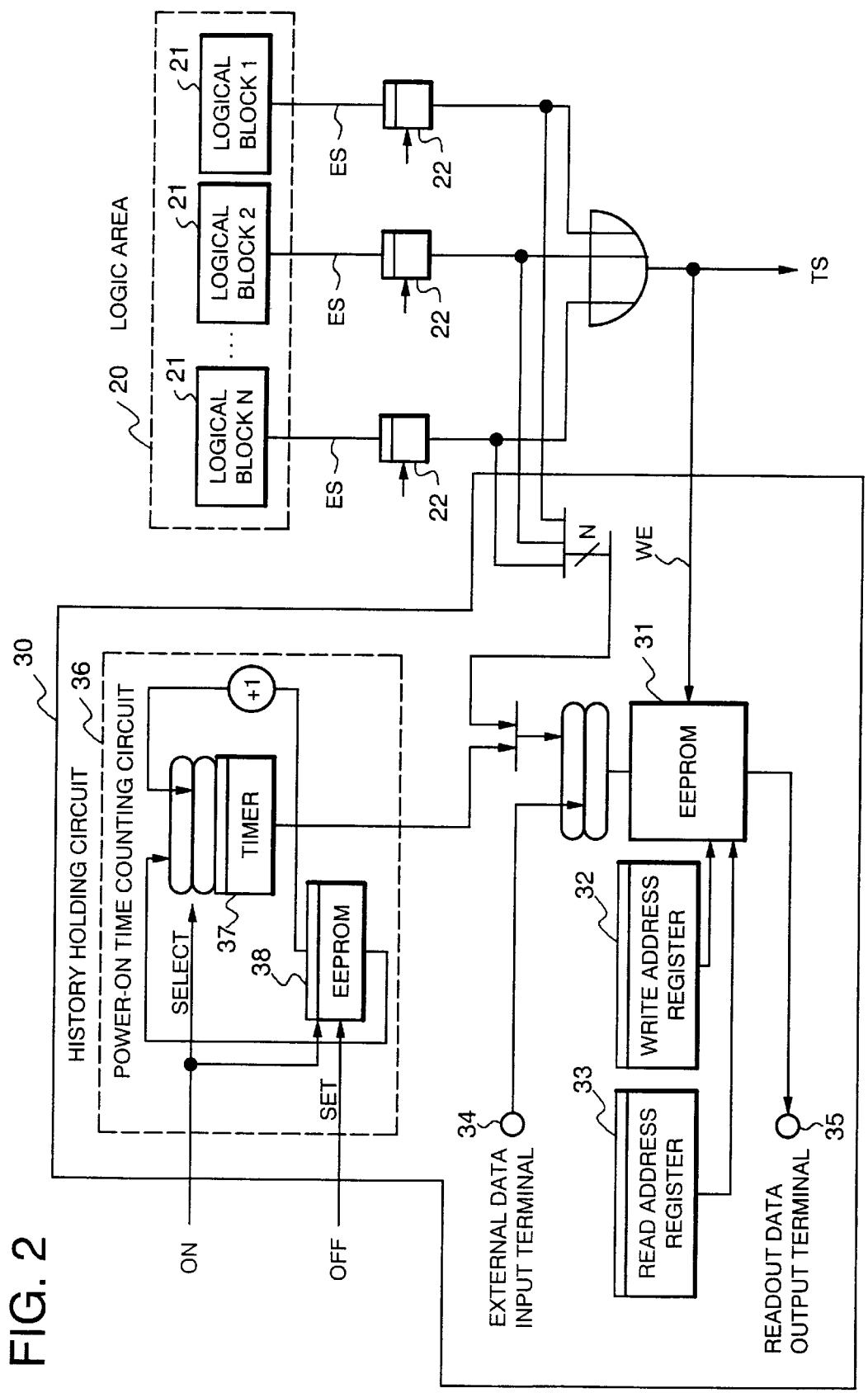
FIG. 2 is a block diagram showing the constitution of a failure history holding circuit according to the present embodiment.

FIG. 2 is a block diagram showing the constitution of the history holding circuit 30.

As shown in FIG. 2, a history circuit 30 includes an EEPROM 31, a write address register 32 and a read address register 33 for writing and reading data into and from the EEPROM 31, an external data input terminal 34 for inputting data to be written into the EEPROM 31, a readout data output terminal 35 for outputting data that have been read from the EEPROM 31, and a power-on time counting circuit 36 for recording current-carrying time for such LSI 10.

Figure 3:
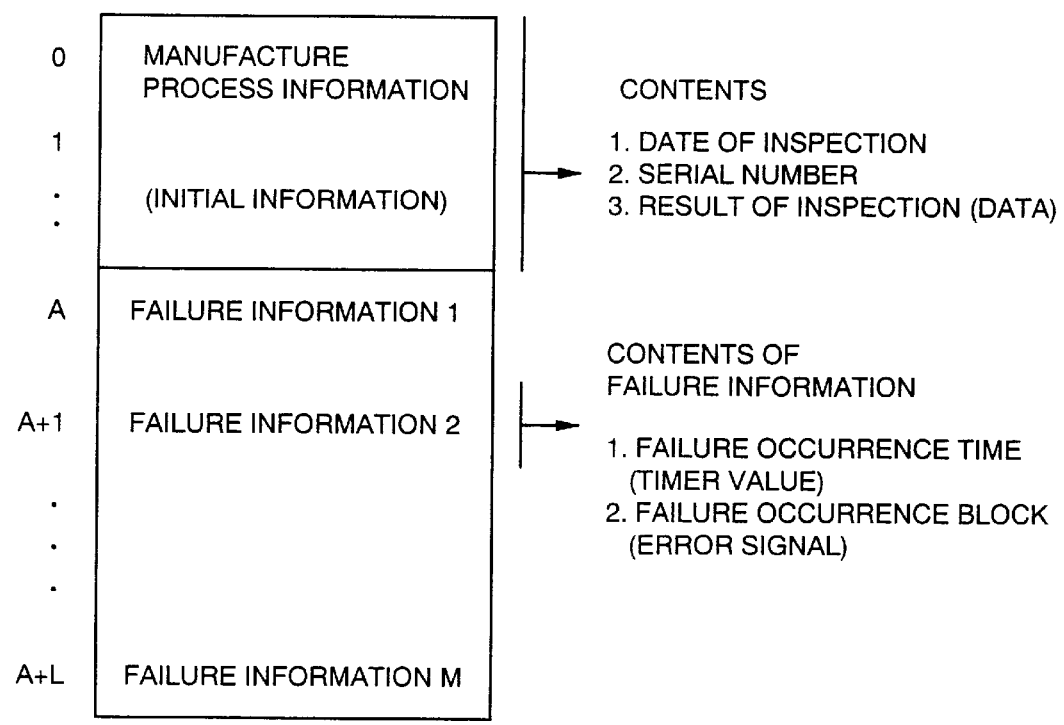
FIG. 3 is a diagram showing the content of the memory area of an EEPROM provided in a failure history holding circuit according to the present embodiment.

As shown in FIG. 3, an EEPROM 31 includes an area into which information that is established during the manufacturing process, such as the serial number and the results and date of inspection for electric and delay characteristics (hereinafter referred to as "initial information"), is written, and an area into which failure information for identifying the time at which a failure occurred and the logical block in which the failure occurred is written. In the example illustrated in the figure, the addresses from 0 to A-1 represent the area into which initial information is written, and the addresses from A to A+L represent the area into which failure information is written.

On completion of the manufacture of an LSI 10, its initial information is written into the addresses in its EEPROM 31 from 0 to A-1 via an external data input terminal 34. After the LSI 10 has been incorporated in an electronic device, failure information is written into the addresses from A to A+L if an error occurs in the logic area 20 of the LSI in the course of the use of the electronic device, such failure information consisting of the information written from a power-on time count circuit 36 for specifying the time when such error occurred and the information that is an error signal ES output from the logic area 20 for specifying the logic block where such error occurred.

Writing data into an EEPROM 31 is performed by setting addresses as desired in the write address register 32. These addresses set in the write address register 32 are incremented every time failure information is written into the EEPROM 31 since failure information is appended every time an error occurs in the LSI 10 after the LSI 10 is incorporated in the electronic device.

Acquiring discrete information concerning an LSI 10 in an electronic device incorporating such LSI 10 is done by outputting the discrete information stored in its EEPROM 31 via a readout data output terminal 35. Reading out data from the EEPROM 31 is done by setting addresses as desired in the read address register 33.

As illustrated, the power-on time counting circuit 36 includes a timer 37 for counting the current-carrying time for an electronic device and an EEPROM 38 for holding the values of the timer 37.

When an electronic device incorporating the LSI 10 is activated, the timer 37 receives a system power-on signal indicating that the system power has been turned on and begins counting up. The timer 37 is for measuring the current-carrying time, so its value does not return to "0". It is thus necessary to make its count-up timing (interval) very slow. For example, if a counter which counts once every one second is employed, the bit number of the counter will have to be around 27 in order for it to operate for three years. A trigger signal for making the counter to count once every one second uses an appropriate bit output of an ordinary timer that is provided in the same LSI 10 (a counter like a system timer that does not stop during the operation of the system).

When the electronic device is deactivated, the EEPROM 38 receives a system power-off signal indicating that the system power will be turned off, and stores and holds the value of the timer 37 at that time. Next time the system power of the electronic device is turned on, the timer 37 loads the value held in the EEPROM 38 and resumes to count up from that value, thus enabling the cumulative calculation of the current-carrying time of the LSI 10.

Also, as shown in FIG. 2, the logic area 20 of the LSI 10 includes several logical blocks 21 for executing logical operation and, as the maintenance function of the LSI 10, error signal holding registers 22, corresponding to the logical blocks 21 in number, for holding temporarily an error signal ES that is output from any of such logical blocks 21 when an error occurs in the logical block. The error signal ES that has been output via the error signal holding register 22 is output as an in-LSI failure occurrence signal TS for notifying the electronic device that a failure has occurred as well as being supplied to the EEPROM 31 as a write enable signal WE of the EEPROM 31.

Operation of the present embodiment will be described.

First, at the time of manufacture of an LSI 10, initial information is written into its EEPROM 31 via the external data input terminal 34. After the LSI 10 has been incorporated in an electronic device, the initial information is read out from the EEPROM 31 via the readout data output terminal 35 when the initial information concerning such LSI 10 is to be confirmed. As the electronic device is used, the current-carrying time for the LSI 10 is counted via the timer 37 of the power-on time counting circuit 36.

If, during the use of the electronic device, an error should occur in any of the logical blocks 21 in the logic area 20 of the LSI 10, an error signal ES is output from the logical block 21 and stored in the error signal holding register 22 corresponding to the logical block 21. The error signal ES which has been output via the error signal holding register 22 is then output as an in-LSI failure occurrence signal TS, notifying the occurrence of a failure to the electronic device as well as being supplied to the EEPROM 31 as a write enable signal WE.

On receiving the write enable signal WE, the EEPROM 31 becomes writable, and the value of the error signal ES held in the error signal holding register 22 and the value of the timer 37 of the power-on time counting circuit 36 at that time are written in. Thus, the information for specifying the logical block 21 in which an error has occurred (the value of the error signal holding register 22) and the failure occurrence time (the total current-carrying time since the LSI 10 was mounted in the electronic device) are stored in the EEPROM 31.

If the LSI 10 should experience frequent errors and requires analysis for the contents of the failures, it is removed from the electronic device and set on an appropriate analyzing device. The initial and failure information accumulated in the EEPROM 31 is then read out via the readout data output terminal, thereby enabling information needed for analysis to be acquired.

As described above, the semiconductor integrated circuit device according to the present invention is so designed as to store the serial number, characteristics data and other discrete information concerning the respective device in the non-volatile memory element provided in the respective device, thereby enabling easy acquisition of discrete information concerning the semiconductor integrated circuit device even after mounting it in an electronic device by reading the discrete information from the non-volatile memory element. Thus, effects can be achieved that time and labor required for managing discrete information concerning the semiconductor integrated circuit device can be reduced and that mistakes in the management procedure for discrete information can be prevented from occurring since the management is not done manually.

Also, since discrete information concerning a semiconductor integrated circuit device can be acquired easily with the semiconductor integrated circuit device mounted in an electronic device, it is not necessary to perform the complicated work of removing the frame of the electronic device for confirming the discrete information.

In addition, if a failure occurs in the semiconductor integrated circuit device, circumstances under which the failure has occurred and the time when the failure occurred are stored automatically in the said non-volatile memory element, providing the effects that time and labor required for creating a failure history can be reduced and that mistakes in the procedures for creating and managing the failure history can be prevented from occurring since the management is not done manually.

Furthermore, since the failure history thus created is stored in the said non-volatile memory element, another effect is achieved that the failure history can be acquired easily and as necessary together with the said discrete information for analyzing the content of the failure that has occurred in the semiconductor integrated circuit device or for other purposes.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A semiconductor integrated circuit device, comprising:

logical operation means for executing logical operations; and history holding means operable with the logical operation means for managing discrete information concerning identification and operation information for the integrated circuit device itself; wherein said history holding means further comprises:

non-volatile memory for storing said discrete information;

input terminal for writing external information into said non-volatile memory; and output terminal for reading out information held in said non-volatile memory.

2. The semiconductor integrated circuit device as set forth in claim 1, wherein said non-volatile memory of said history holding means stores, as said discrete information, at least a serial number of the integrated circuit device.

3. The semiconductor integrated circuit device as set forth in claim 1, wherein said non-volatile memory of said history holding means stores, as said discrete information, at least a serial number of the integrated circuit device and measurement results for various characteristics obtained by said logical operation means.

4. The semiconductor integrated circuit device as set forth in claim 1, wherein said non-volatile memory of said history holding means is an EEPROM.

5. The semiconductor integrated circuit device as set forth in claim 1, wherein when an error occurs in said logical operation means, said history holding means receives an error signal output from the logical operation means, and write a value of the error signal into said non-volatile memory.

6. The semiconductor integrated circuit device as set forth in claim 1, wherein said non-volatile memory of said history holding means stores, as said discrete information, at least a serial number of the integrated circuit device and measurement results for various characteristics obtained by said logical operation means, and when an error occurs in said logical operation means, said history holding means receives an error signal output from the logical operation means, and write a value of the error signal into said non-volatile memory.

7. The semiconductor integrated circuit device as set forth in claim 1, wherein said history holding means further comprises power-on time counting means for counting a total current-carrying time by monitoring an ON/OFF status of system power of an electronic device into which the integrated circuit device is incorporated, and writing the total current-carrying time counted by said power-on time counting means into said non-volatile memory.

8. The semiconductor integrated circuit device as set forth in claim 1, wherein said non-volatile memory of said history holding means stores, as said discrete information, at least a serial number of the integrated circuit device and measurement results for various characteristics obtained by said logical operation means, and said history holding means further comprises power-on time counting means for counting a total current-carrying time by monitoring an ON/OFF status of system power of an electronic device into which the integrated circuit device is incorporated, and writing the total current-carrying time counted by said power-on time counting means into said non-volatile memory.

9. The semiconductor integrated circuit device as set forth in claim 1, wherein said history holding means further comprises power-on time counting means for counting a total current-carrying time by monitoring an ON/OFF status of an electronic device into which the integrated circuit device is incorporated, and wherein when an error occurs in said logical operation means, said history holding means receives an error signal output from the logical operation means and writes a value of the error signal into said non-volatile memory, and writes the total current-carrying time counted by said power-on time counting means into said non-volatile memory at the time of error occurrence.

10. The semiconductor integrated circuit device as set forth in claim 1, wherein said non-volatile memory of said history holding means stores, as said discrete information, at least a serial number of the integrated circuit device and measurement results for various characteristics obtained by said logical operation means, and said history holding means further comprises power-on time counting means for counting a total current-carrying time by monitoring an ON/OFF status of system power of an electronic device into which the integrated circuit device is incorporated, and wherein when an error occurs in said logical operation means, said history holding means receives an error signal output from the logical operation means and write a value of the error signal into said non-volatile memory, and writes the current-carrying time counted by said power-on time counting means into said non-volatile memory.

11. The semiconductor integrated circuit device of claim 9, wherein when an error occurs in said logical operation means, said logical operation means sends a second error signal to the electronic device.

12. A semiconductor integrated circuit device, comprising:

logical operation means for executing logical operations; and history holding means operable with the logical operation means for automatically managing discrete information concerning identification and operation information for the integrated circuit device itself; wherein said history holding means further comprises:

non-volatile memory for storing said discrete information, said discrete information comprising a serial number and delay characteristics of the integrated circuit device;

input terminal for writing external information into said non-volatile memory; and output terminal for reading out information held in said non-volatile memory.

13. The semiconductor integrated circuit device of claim 12, wherein said history holding means further comprises:
  power-on time counting means for counting a total current-carrying time by monitoring an ON/OFF status of an electronic device into which the integrated circuit device is incorporated, and wherein
  when an error occurs in said logical operation means, said history holding means receives an error signal output from the logical operation means and writes a value of the error signal into said non-volatile memory, and writes the total current-carrying time counted by said power-on time counting means into said non-volatile memory at the time of error occurrence.

14. The semiconductor integrated circuit device of claim 13, wherein
  when an error occurs in said logical operation means, said logical operation means sends a second error signal to the electronic device.

\* \* \* \* \*